United States Patent
Matsuo et al.

(10) Patent No.: US 8,120,049 B2
(45) Date of Patent: Feb. 21, 2012

(54) LIGHT-EMITTING SEMICONDUCTOR DEVICE

(75) Inventors: Tetsuji Matsuo, Saitama (JP); Shiro Takeda, Saitama (JP)

(73) Assignee: Sanken Electric Co., Ltd. (JP)

( * ) Notice: Subject to any disclaimer, the term of this patent is extended or adjusted under 35 U.S.C. 154(b) by 291 days.

(21) Appl. No.: 12/141,273

(22) Filed: Jun. 18, 2008

(65) Prior Publication Data

US 2008/0315232 A1 Dec. 25, 2008

(30) Foreign Application Priority Data

Jun. 22, 2007 (JP) .................................. 2007-165261

(51) Int. Cl.
*H01L 33/54* (2010.01)
*H01L 33/46* (2010.01)

(52) U.S. Cl. .................. 257/98; 257/100; 257/E33.068; 257/E33.072

(58) Field of Classification Search ............... 257/98, 257/100, E33.072, E33.068
See application file for complete search history.

(56) References Cited

U.S. PATENT DOCUMENTS

| 6,091,195 | A | * | 7/2000 | Forrest et al. | 313/504 |
| 6,121,636 | A | * | 9/2000 | Morita et al. | 257/99 |
| 6,630,689 | B2 | * | 10/2003 | Bhat et al. | 257/79 |
| 6,650,045 | B1 | * | 11/2003 | Forrest et al. | 313/504 |
| 6,891,197 | B2 | * | 5/2005 | Bhat et al. | 257/79 |
| 2006/0145174 | A1 | * | 7/2006 | Lee et al. | 257/98 |
| 2006/0228094 | A1 | * | 10/2006 | Alasaarela et al. | 385/147 |

FOREIGN PATENT DOCUMENTS

| EP | 772248 | A2 | * | 5/1997 |
| JP | 07074395 | A | * | 3/1995 |
| JP | 2000031540 | A | * | 1/2000 |
| JP | 2004-055816 | | | 2/2004 |
| JP | 2005-277372 | | | 10/2005 |

* cited by examiner

*Primary Examiner* — George Fourson, III
(74) *Attorney, Agent, or Firm* — Woodcock Washburn LLP (57) ABSTRACT

A light-generating semiconductor region is grown on a substrate of electroconductive silicon or like light-absorptive material. An anode is placed atop the light-generating semiconductor region, and a cathode under the substrate. The light-generating semiconductor region and the substrate are encapsulated in an epoxy envelope. In order to prevent the substrate from absorbing the light that has been radiated from the light-generating semiconductor region and reflected back from the envelope, the substrate has its side surfaces covered by a reflector layer. The reflector layer has its surfaces roughened, as a result of the roughening of the underlying substrate surfaces by dicing, for scattering the incident light.

11 Claims, 4 Drawing Sheets

LIGHT-EMITTING SEMICONDUCTOR DEVICE

CROSS REFERENCE TO RELATED APPLICATIONS

This application claims priority to Japanese Patent Application No. 2007-165261, filed Jun. 22, 2007.

BACKGROUND OF THE INVENTION

This invention relates generally to light-emitting semiconductor devices, or light-emitting diodes (LEDs) according to common parlance, and particularly to those having a light-absorptive substrate and a transparent envelope. More particularly, the invention deals with an LED featuring provisions for improved efficiency and directivity.

The LED of typical conventional make comprises a light-generating semiconductor region grown on a substrate, an electrode to one of a pair of opposite major surfaces of the light-generating semiconductor region, and another electrode to the other major surface of the light-generating semiconductor region. The light-generating semiconductor region together with the substrate is encapsulated in a transparent envelope.

The substrate of the LED may be made from electrical insulators notably including sapphire, which is highly transparent, or from electrical conductors including silicon and compound semiconductors such as those based upon gallium arsenide (GaAs) or gallium phosphide (GaP). All these conductive are cheaper than sapphire and additionally advantageous over the insulators in making the substrate a path for the LED drive current. However, the conductors are far more absorptive of light than sapphire, causing a great deal of the light radiated from the light-generating semiconductor region toward the substrate to be thereby absorbed and wasted and so lessening the efficiency of the LED.

A remedy to this dilemma is suggested for example in Japanese Unexamined Patent Publication No. 2005-277372. It teaches use of a reflector between the light-generating semiconductor region and the substrate of light-absorptive material. The light radiated toward the substrate is saved by being reflected back toward the light-emitting surface of the LED.

This prior art device has proved to possess a weakness: Part of the light issuing from the light-generating semiconductor region is reflected by the envelope back toward the substrate to be thereby absorbed through its side surfaces. As the LED has developed more and more in recent years for less energy consumption and greater optical output, such light absorption by the substrate presents now a hitch not to be overlooked for still higher LED efficiency. The Japanese patent publication cited hereinabove is silent on how to defeat this problem Efficiency aside, the LED is required to possess "directional uniformity," by which is meant a measure of evenness of light intensity in a given zone of illumination. This property is of particular significance in use of the LED as illuminator or the like. The patent publication above discloses no measures for directional uniformity, either.

Japanese Unexamined Patent Publication No. 2004-55816 makes a different approach to how to improve the efficiency of an LED incorporating a sapphire substrate. This second prior art device has its light-generating semiconductor region so formed on the surface of the substrate as to leave an annular marginal part of the surface unoccupied. An annular slit is formed in this marginal part of the substrate surface. The side of the light-generating semiconductor region, as well as the surfaces bounding the annular slit, is covered with a reflective film in order to make possible the emission of the light that has been radiated laterally of the light-generating semiconductor region.

It is submitted that the second prior art device is not anticipatory of the instant invention. The former is expressly designed for enhancement of efficiency through reduction of lateral light diffusion from the light-generating semiconductor region and substrate. The present invention presupposes use of a substrate of light-absorptive material and aims at prevention of the light reflected inwardly by the LED envelope from being absorbed by the substrate.

SUMMARY OF THE INVENTION

The present invention has it as an object to enhance the efficiency of an LED of the type defined.

Another object of the invention is to improve the directional uniformity of the LED of the type defined.

Briefly, the present invention may be summarized as a light-emitting semiconductor device of improved efficiency and directivity, comprising a light-generating semiconductor region on one of the pair of opposite major surfaces of a substrate for generating light to be emitted, a first and a second electrode electrically connected to the light-generating semiconductor region, and a transparent envelope enclosing the substrate and the light-generating semiconductor region. Also included is a reflector layer covering at least part of the surfaces of the substrate for reflecting the light that has been reflected from the transparent envelope.

Preferably, the reflector layer is surface roughened for scattering the light impinging thereon. The reflector layer can be surface roughened simply as a desired reflective material such as aluminum, silver or titanium is deposited on previously roughened parts of the substrate surfaces. There is no need for intentional roughening of the substrate surfaces, either. The side surfaces of the substrate are roughened automatically simply as, during mass production of LEDs according to the invention, the wafer is blade diced into the individual LED chips.

In a preferred embodiment the reflector layer covers parts of the side surfaces of the substrate, such parts having been previously roughened by half dicing of the wafer with a blade. In another embodiment the reflector layer additionally covers the marginal part of the one major surface of the substrate on which is formed the light-generating semiconductor region.

As explained above in connection with the prior art, not all the light that has been produced at the light-generating semiconductor region traverses the envelope as a useful optical output, but a fraction of the light is reflected inwardly by the envelope. The reflector layer on the substrate is intended to redirect toward the envelope the light that has been sent back therefrom, rather than, as has been the case heretofore, allow such light to be absorbed by the substrate and so wasted. An improvement in efficiency is thus realized.

By reflecting the light, the reflector layer itself on the substrate serves as additional part of the light source, thereby adding to the "directional uniformity" of the device. The "directional uniformity" of the device is even more improved by roughening the surfaces of the reflector layer.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

The present invention will now be described more specifically in terms of its first preferred form illustrated in FIG. 1. The representative LED includes a substrate 1 on which there is formed a light-generating semiconductor region 2. A first electrode or anode 3 is disposed atop the light-generating semiconductor region 2 whereas a second electrode or cathode 4 underlies the substrate 1. All the parts of the LED so far mentioned are mounted on a metal-made baseplate 7 and encapsulated in a transparent envelope 5 of hemispherical shape.

The substrate 1 serves both as a basis on which is grown the light-generating semiconductor region 2 and as a mechanical support therefor. Generally boxlike in shape, the substrate 1 has a top or first major surface 10, a bottom or second major surface 11, and a set of four side surfaces 12. The substrate 1 will be in the shape of a truncated pyramid if its sides are beveled when it is diced from the wafer, as in a different embodiment of the invention to be disclosed subsequently. Various other alternative shapes are possible for the substrate 1, such as a column, a truncated cone, and a prism or truncated pyramid of other than four sides.

The present invention presupposes use of a light-absorptive material for the substrate 1. Electroconductive silicon, which is more light-absorptive but far less expensive than sapphire, is employed in this particular embodiment. Other materials adoptable for the substrate 1 include GaAs- or GaP-based compound semiconductors, metals and insulators. In short the principles of this invention are applicable to all LEDs in which the substrate is made from a material that absorbs the light generated.

The side surfaces 12 of the substrate 1 are roughened, as a result of blade half dicing of the wafer for example, at least in part as indicated diagrammatically at 13. The roughened parts 13 of the substrate side surfaces 12 are covered with a reflector layer 6 according to the novel concepts of this invention. More will be said presently about these features of the invention.

Grown by epitaxy on the top surface 10 of the substrate 1, the light-generating semiconductor region 2 comprises a buffer layer 14, an n-type semiconductor layer 15, an active layer 16, and a p-type semiconductor layer 17, all placed in that order one on top of another. What follows is a detailed explanation of these constituent layers 14-17 of the light-generating semiconductor region 2.

The buffer layer 14 takes the form of a lamination of a required number of alternations of aluminum nitride (AlN) and gallium nitride (GaN) sublayers. This construction of the buffer layer 14 is modifiable in various ways without departing from the scope of the invention. For example, it may be either a lamination of alternating two different nitride semiconductors other than AlN and GaN, or a unitary layer of AlN or some other nitride semiconductor. Whatever its construction, the buffer layer 14 may be considered a part independent of, instead of a constituent part of, the light-generating semiconductor region 2. It is even possible to eliminate this buffer layer 14 altogether, forming the n-type semiconductor layer 15 directly on the substrate 1.

The n-type semiconductor layer 15 is known as the lower cladding of the overlying active layer 16. It is formed by epitaxially growing an n-type nitride semiconductor (e.g., n-doped GaN) on the buffer layer 14.

For providing a double heterojunction LED, the active layer 16 is formed by epitaxially growing an undoped nitride semiconductor (e.g., InGaN) on the n-type semiconductor layer 15. The active layer 16 may be either of the same composition throughout, as shown, or take the form of the known multiple quantum well structure. Light will be generated if there are only the n-type layer 15 and p-type layer 17. Therefore, in applications where the double heterodyne construction is not a requisite, the active layer 16 is omissible.

The p-type semiconductor layer 17, the upper cladding of the active layer 16, is formed by epitaxially growing a p-type nitride semiconductor (e.g., p-doped GaN) on the active layer. As required or desired, the known current-spreading or ohmic contact layer of a p-type nitride semiconductor (e.g., p-doped GaN) might be provided on the p-type semiconductor layer 17.

Constructed as in the foregoing, the light-generating semiconductor region 2 has a top or first major surface 18 from which a greater proportion of the light generated at the active layer 16 is emitted, a bottom or second major surface 19 held against the top 10 of the substrate 1, and a side surface or surfaces 20. The light from the active layer 16 issues not only from the top 18 of the light-generating semiconductor region 2 but from its side 20 as well.

The anode 3 is placed centrally atop the light-generating semiconductor region 2. A terminal 8 extending through the baseplate 7 is coupled to the anode 3 via a conductor 9. A tubular insulator 22 is sleeved upon the terminal 8 in order to electrically isolate the same from the baseplate 7. Underlying the substrate 1, the cathode 4 is coupled, both mechanically and electrically, to the metal-made baseplate 7 with an electroconductive bonding agent 21. Thus the baseplate 7 functions as both electrical conductor and heat radiator besides serving to mechanically support the substrate 1 and light-generating semiconductor region 2.

The hemispherical envelope 5 is made from a mechanically strong, optically transparent synthetic resin (e.g., epoxy resin) with a refractive index of 1.5 or so. Mounted fast on the baseplate 7, the envelope completely encloses the substrate 1 and light-generating semiconductor region 2.

The substrate 1 has at least parts of its side surfaces 12 roughened (i.e., made to bear a multiplicity of minute rises and falls) at 13 as aforesaid. The roughening of the parts 13 of the substrate side surfaces 12 is intended to impart corresponding rough surfaces 23 to the reflector layer 6 formed subsequently thereon. The roughening of the parts 13 and the reflector layer 6 are formed in the incidence position of the light that has been reflected from the transparent envelope 5. For most effectively scattering the light reflected from the envelope 5, the rises and falls in the roughened parts 13 of the substrate side surfaces 12, and therefore in the surfaces 23 of the reflector layer 6 deposited thereon, should be from about 100 nanometers to about 10 micrometers thick and from about 200 nanometers to about 20 micrometers wide, preferably from about 0.5 micrometer to about 1.0 micrometer deep and from about 0.7 micrometer to about 1.5 micrometers wide. The side surfaces 12 of the substrate 1 and the surfaces of the reflector layer 6 need not be roughened in cases where the reflector layer is not required to scatter the light.

The roughening of the substrate side surfaces 12 can be accomplished by the familiar blade dicing of the wafer in separating the same into a multiplicity of LED chips according to the usual practice in the semiconductor industry. Following the growth on the wafer of the constituent layers 14-17 for the light-generating semiconductor regions 2 of all the LEDs being fabricated, these layers may be separated into the individual light-generating semiconductor regions by either dry or wet etching. Then the substrate part of the wafer may be half diced using a relatively thick (e.g., 40-60 micrometers) blade, preparatory to final separation into LED chips. The half dicing, rather than full dicing, of the wafer creates shallow slits therein, leaving connective parts with a thickness of 50-100 micrometers by which the LED chips are left joined to one another. After the creation of the reflector layer 6 on the side surfaces of the substrates 1 of all the LED chips, these connective parts may be severed either by blade dicing, this time using a blade as thin as 30 micrometers or less, or by breaking. Thus are simultaneously obtained a multiplicity of LED chips each embodying the features of this invention as in FIG. 1.

No additional step of surface-roughening the reflector layer 6 is necessary because the blade dicing of the wafer serves also to impart roughness to the side surfaces 12 of all the substrates 1. The rises and falls thus created by blade dicing in the side surfaces of the substrates have proved to fall within the required ranges of from about 100 nanometers to 10 micrometers in depth and from about 200 nanometers to about 20 micrometers in width. The side surfaces 12 of the substrate 1 are shown in FIG. 1 as at right angles with the pair of major surfaces 10 and 11 of the substrate for simplicity of illustration. Actually, however, the substrate 1 may taper upwardly at an angle of 80-85 degrees or so with respect to the bottom of the substrate.

The reflector layer 6 covering the roughened surfaces 13 of the substrate 1 should be significantly more reflective than the substrate. In order to be so reflective, the reflector layer may be either a mono- or multilayered film of aluminum or aluminum-base alloy, silver or silver-base alloy, or titanium or titanium-base alloy, or a multilayered film of oxides such as silicon oxide and zirconium oxide.

Any such reflective material may be deposited on the exposed surfaces of the wafer after it has been half diced as above. Then the deposit may have its undesired parts photolithographically removed, leaving only the reflector layer 6 on the roughened surfaces 13 of the substrate 1. Deposited on the roughened substrate surfaces, the reflector layer 6 will have itself correspondingly roughened surfaces 23 for scattering the light reflected from the envelope 5. The roughness (depth and pitch) of the surfaces 23 of the reflector layer 6 is approximately equal to that of the surfaces 13 of the substrate 1. The reflector layer 6 is so positioned on the substrate 1 as to be irradiated by the light that, after issuing from the light-generating semiconductor region 2, is reflected from the outside surface (interface with the air) of the envelope 5.

The benefits offered by this representative embodiment of the invention may be recapitulated as follows:

1. Part of the light emerging from the light-generating semiconductor region 2 will irradiate the transparent envelope 5 at such an angle of incidence as to be reflected back toward the substrate 1 of light-absorptive material, as indicated by the broken-line arrow designated 50 in FIG. 1. Such light, instead of being absorbed by the substrate 1, will be reflected again by the reflector layer 6 on the roughened substrate surfaces 13. The re-reflected light will eventually traverse the envelope 5 and add to the intensity of the optical output from the LED. The efficiency of the LED is improved through reduction of light absorption by the substrate 1 to a minimum.

2. The reflector layer 6 apparently functions as light source, with consequent enhancement of the "directional uniformity" of the light emitted.

3. The "directional uniformity" is further enhanced as the reflector layer 6 has the roughened surfaces 23 for scattering the light, to such an extent that the LED is fit for use as illuminator.

4. The reflector layer 6 is surface roughened by taking advantage of the surface roughness of the substrate brought about by blade half-dicing of the wafer, so that no extra manufacturing step is needed for that purpose.

Figure 2:
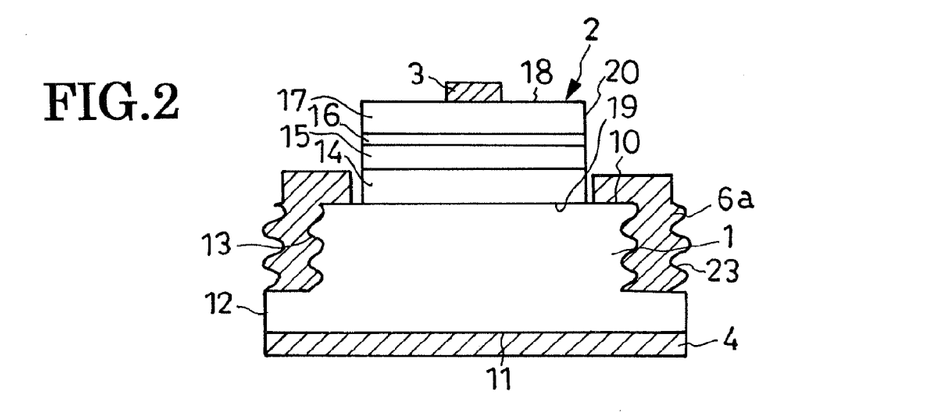
FIG. 2 is a vertical section through another preferred form of LED according to the invention, the view not showing the encapsulation for simplicity.

Embodiment of FIG. 2

Figure 1:
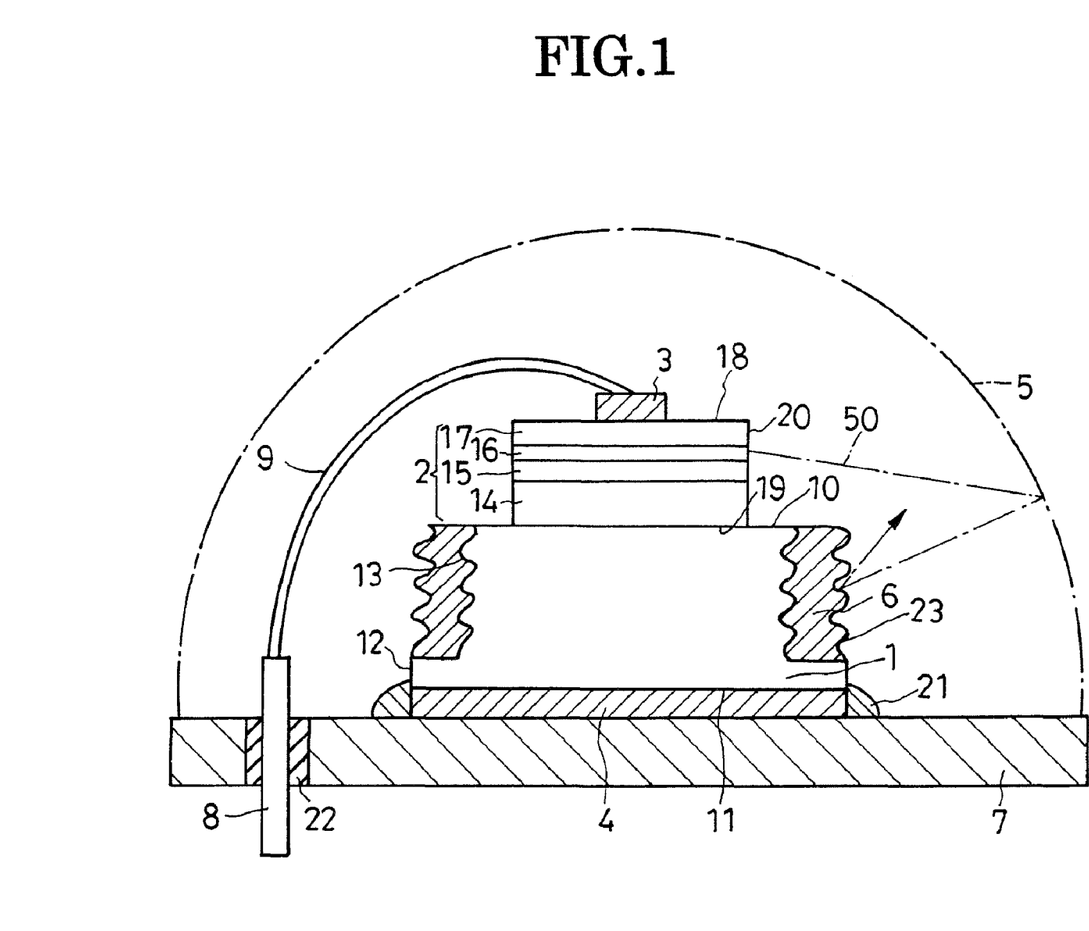
FIG. 1 is a vertical section through the LED built on the novel concepts of this invention.

This embodiment is of the same make as that of FIG. 1 except for a modified reflector layer $6_a$. The reflector layer $6_a$ not only covers the roughened parts 13 of the side surfaces 12 of the substrate 1, as in the preceding embodiment, but additionally overlies the marginal portion of the top surface 10 of the substrate which is left exposed by the light-generating semiconductor region 2. That part of the reflector layer $6_a$ which covers the roughened parts 13 of the substrate side surfaces 12 is correspondingly roughened at 23.

The modified reflector layer $6_a$ offers a greater area for redirecting the light that has been reflected from the envelope, not shown here, than does its counterpart 6 in the FIG. 1 embodiment. The reflector layer $6_a$ reflects not only the light falling on the side surfaces 12 of the substrate 1 but also that impinging on its top surface 10. Thus, besides winning all the listed benefits of the FIG. 1 embodiment, this LED is further improved in both efficiency and "directional uniformity."

Figure 3:
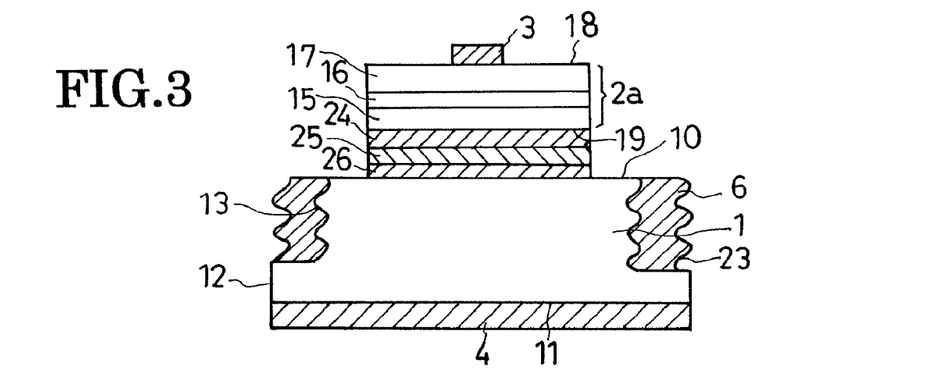
FIG. 3 is a vertical section through yet another preferred form of LED according to the invention, the view not showing the encapsulation for simplicity.

Embodiment of FIG. 3

This embodiment features a modified light-generating semiconductor region $2_a$, a second reflector layer 24 under the modified light-generating semiconductor region, and layers 25 and 26 of an electroconductive bonding agent through which the light-generating semiconductor region $2_a$ with the underlying second reflector layer 24 is bonded to the substrate 1. All the other details of construction are as previously set forth with reference to FIG. 1.

The modified light-generating semiconductor region $2_a$ has the active layer 16 with its claddings 15 and 17 but no buffer layer. Made from aluminum, silver or like metal to possess greater reflectivity than the substrate 1, the second reflector layer 24 is mechanically attached to the bottom surface 19 of the light-generating semiconductor region $2_a$ and electrically coupled to the lower cladding 15. The second reflector layer 24 is further bonded to the substrate 1 via the layers 25 and 26 of metal such as, most appropriately, gold.

This LED realizes a further rise in efficiency besides gaining all the benefits listed in connection with the first disclosed embodiment. Thanks to the second reflector layer 24, the light that has been radiated from the active layer 16 of the light-generating semiconductor region $2_a$ toward the substrate 1 is reflected back toward the light-emitting surface 18 of the light-generating semiconductor region, instead of being absorbed by the substrate.

Figure 4:
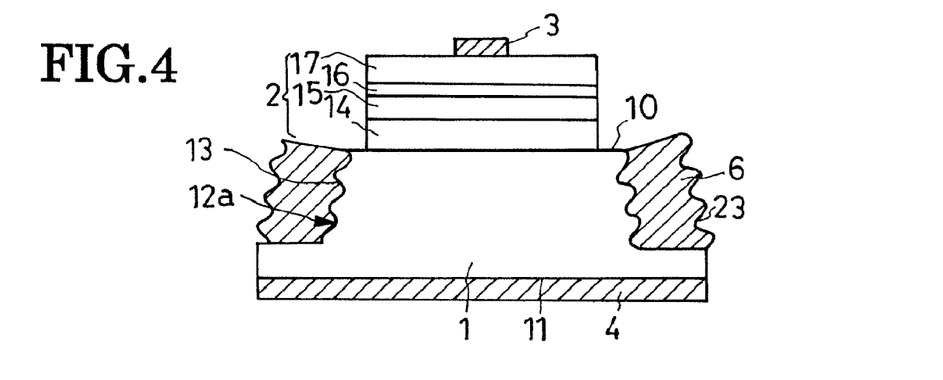
FIG. 4 is a vertical section through still another preferred form of LED according to the invention, the view not showing the encapsulation for simplicity.

Embodiment of FIG. 4

The substrate 1 of this embodiment tapers as it extends from the baseplate 7, FIG. 1, toward the light-generating semiconductor region 2; that is, its side surfaces $12_a$ are not normal, but at an angle, to the baseplate 7. This embodiment is akin to that of FIG. 1 in all the other details of construction. The angled side surfaces $12_a$ of the substrate 1 are obtainable by half or full dicing of the wafer using an angled (e.g., 45-80 degrees) blade, thereby concurrently roughening these surfaces. Alternatively, the substrate side surfaces may be angled by etching or other methods.

As the angled side surfaces $12_a$ of the substrate 1 are roughened as at 13, so are the surfaces of the reflector layer 6 deposited subsequently thereon, as indicated at 23. These roughened surfaces 23 of the reflector layer 6 on the angled substrate surfaces $12_a$ will more effectively reflect the light upwardly of the device than in the case where the substrate side surfaces are perpendicular to the baseplate as in all the foregoing embodiments. The teachings of this embodiment are applicable to the embodiments of FIGS. 2 and 3 as well.

Figure 5:
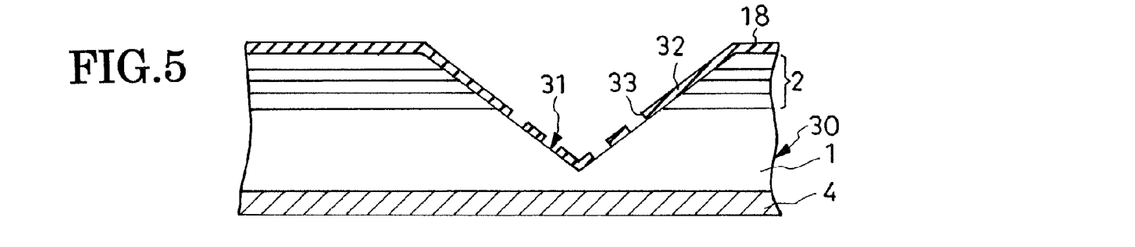
FIG. 5 is a fragmentary vertical section through a wafer used for fabrication of LEDs according to the invention, the view being explanatory of how the surfaces of the wafer are roughened preparatory of the deposition of the reflector layer thereon.

Embodiment of FIG. 5

The LEDs according to the invention may be fabricated by an alternative method illustrated in FIG. 5. The wafer 30 shown here has the substrate 1 on which there have been formed the constituent layers of a multiplicity of light-generating semiconductor regions 2 which are to be separated from one another. A crisscross of V-sectioned slits 31, one shown, are etched into the top surface 18 of the wafer 30 so as to terminate short of its bottom. For roughening the surfaces bounding the slits 31, which in fact are the side surfaces of the individual substrates 1, an etchant-resist mask 32 is formed on these surfaces as well as on the top surfaces of the light-generating semiconductor regions 2. The mask 32 has a multiplicity of minute perforations preformed therethrough.

Then the article of FIG. 5 may be subjected to either dry (e.g., plasma) or wet etching. Etched through the mask 32, the wall surfaces of the slits 31 will be roughened like the substrate surfaces 13 of the FIG. 1 embodiment. Then a desired reflective material may be deposited on these roughened substrate surfaces thereby creating the surface-roughened reflector layer designated 6 or $6_a$ in the foregoing embodiments. Then the wafer 30 may be divided into the individual LED chips.

Alternatively, the V-sectioned slits 31 may be formed by blade dicing. This method of LED fabrication is applicable to the LEDs having the second reflector layer shown at 24 in FIG. 3.

Figure 6:
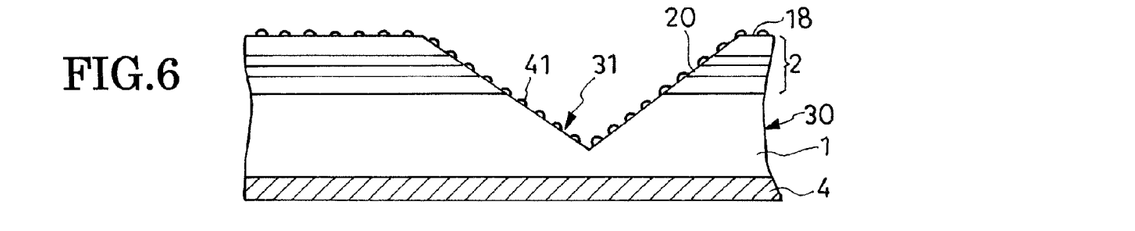
FIG. 6 is a view similar to FIG. 5 but explanatory of an alternative method of roughening the surfaces of the wafer.

Embodiment of FIG. 6

Here is shown another method of surface roughening for use in fabricating the LEDs proposed by this invention. V-sectioned slits 31 are first formed crisscross in the top surface 18 of the wafer 30 as in the above described method of FIG. 5. Then the surfaces bounding the slits 31 as well as the top surface 18 of the wafer 30 are covered with a particulate mask 41 which has been made, in a manner to be detailed below, from a metal that is capable of thermal coagulation into particulate form. Then these surfaces are roughened by etching, preferably dry, through the particulate mask 41.

More specifically, silver is recommended as a material of the particulate mask 41 for the ease with which it thermally coagulates into particles. Silver may be first vacuum deposited all over the walls of the slits 31 and the top surface 18 of the wafer 30. In cases where the light-generating semiconductor regions 2 need not be roughened, the undesired parts of the wafer 30 may be masked against such roughening. Silver may be deposited to a thickness of about 2-100 nanometers, preferably about 10-30 nanometers, and for the best results about 20 nanometers. The thickness of the silver deposit depends upon the desired size of the particles. If more than about 100 nanometers thick, the silver deposit may not coagulate into discrete particles (surface not sufficiently roughened) and, if less than about 2 nanometers thick, may fail to provide particles of desired size (surface roughened but too fine).

Metals other than silver are adoptable for the particulate mask 41, examples being silver-base alloy, aluminum or aluminum-base alloy, copper or copper-base alloy, and gold or gold-base alloy. Any such metal or alloy may be applied to the slitted wafer surfaces by any known methods other than vacuum deposition, such as sputtering, electron beam physical vapor deposition, and coating.

The vacuum deposition of silver is possible with the wafer held at room temperature, but the wafer temperature may be raised up to about 150° C. Optionally, during silver deposition thereon, the wafer may be held at such an elevated temperature (150-500° C.) that the deposited silver may immediately coagulate into particles.

Following the deposition of silver on the slitted wafer 30, this wafer may be heated to a temperature of 300° C. in a furnace that is in widespread use in the semiconductor industry. The silver deposit will then coagulate into particulate form suitable for use as the particulate etching-resist mask 41. Generally, the silver deposit within the thickness range specified above will coagulate successfully on being heated to a temperature range of about 250-350° C.

The silver particles obtained by the above heating of the wafer 30 will be somewhat irregularly dispersed over the wafer surfaces. The size of these particles will change roughly in proportion with the thickness of the silver film deposited. If the silver film is 20 nanometers thick, the particle size will range from 50 nanometers to 200 nanometers, averaging 130 nanometers. The silver film would thermally coagulate into reticulate, rather than particulate, form if it were more than 50 nanometers thick and, if more than 100 nanometers thick, partly into thick reticulate form and partly into thin film. No solid particles of desired size would be obtained in either case. The silver film should therefore be about 2-100 nanometers thick as aforesaid.

Coagulating from the 20 nanometers thick film, the silver particles will average 4-15 in number per square micrometer. Generally, the number of the silver particles per unit area will be in inverse proportion with the thickness of the film. Although there is no particular regularity in the distribution of the silver particles, they will nevertheless be relatively uniformly distributed over the entire wafer surfaces.

Through the particulate mask 41 thus prepared, the required wafer surfaces are dry (plasma) etched for about 10-30 minutes. Not only the side surfaces of the substrates 1 but also the top surfaces 18 and side surfaces 20 of the light-generating semiconductor regions 2 are simultaneously roughened in this method. These roughened surfaces 18 and 20 of the light-generating semiconductor regions 2 are conducive to enhancement of the LED efficiency through elimination of internal total reflection between the light-generating semiconductor region 2 and the envelope 5.

Next comes the step of removing the particulate silver mask 41 from over the wafer surfaces. Any known etchant that attacks silver may be employed to this end, such as an aqueous solution of hydrogen chloride (HCl) or of ammonium hydroxide ($NH_4OH$) and hydrogen peroxide ($H_2O_2$). The mask 41 may be etched away by treating the wafer 30 with any such etchant for about two minutes at room temperature.

In order to make the thus-roughened surfaces of the wafer 30 reflective as at 6 in FIG. 1, a desired reflective material may be deposited on the exposed surfaces of the wafer. Then undesired parts of the reflective deposit may be photolithographically removed. Deposited on the roughened wafer surfaces, the reflective layer will have its surfaces correspondingly roughened as at 23 in FIG. 1. Then the wafer 30 may be severed along the slits 31 into individual LED chips.

It will be recalled that in the LED shown in FIG. 1, the reflector layer 6 is surface roughened by taking advantage of the roughness of the side surfaces of the substrate 1 created by blade dicing of the wafer. The same purpose is accomplished in FIG. 6 by etching the substrate surfaces through the particulate mask 41. This alternative method makes possible the finer control of the surface roughness of the reflector layer 6, Embodiment of FIG. 7

Figure 7:
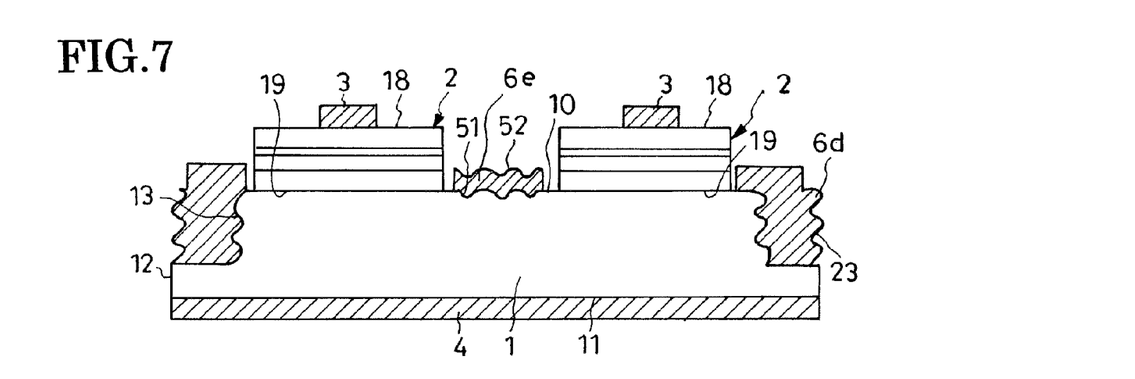
FIG. 7 is a vertical section through a further preferred form of LED according to the invention, the view not showing the encapsulation for simplicity.

The LED shown here has a plurality of, two seen, light-generating semiconductor regions 2 formed on the top surface 10 of a substrate 1 with a spacing from one to the next. The substrate 1 has its side surfaces 12, as well as marginal part of its top surface 10, covered with a surface-roughened reflector layer $6_d$ as in the embodiment of FIG. 2. Another surface-roughened reflector layer $6_e$ covers the substrate top surface 10 at the spacing between the light-generating semiconductor regions 2. The surface-roughened reflector layer $6_d$ and the surface-roughened reflector layer $6_e$ are so positioned on the substrate 1 as to be irradiated by the light that, after issuing from the light-generating semiconductor region 2, is reflected from the outside surface (interface with the air) of the envelope. All the other details of construction of this composite LED, including that of each light-generating semiconductor region 2, are as set forth above with reference to FIG. 1.

For providing the surface-roughened reflector layer $6_e$ on the substrate top surface 10, this substrate top surface is itself roughened at 51. By being deposited on this roughened part of the substrate top surface 10, the reflector layer $6_e$ has its surface roughened at 52.

Besides winning all the benefits stated in connection with the embodiments of FIGS. 1 and 2, this embodiment offers the advantage that the light is better scattered by the surface-roughened reflector layer $6_e$ between the light-generating semiconductor regions 2. The "directional uniformity" of this LED is therefore much better than in the absence of the surface-roughened reflector layers $6_d$ and $6_e$.

Figure 8:
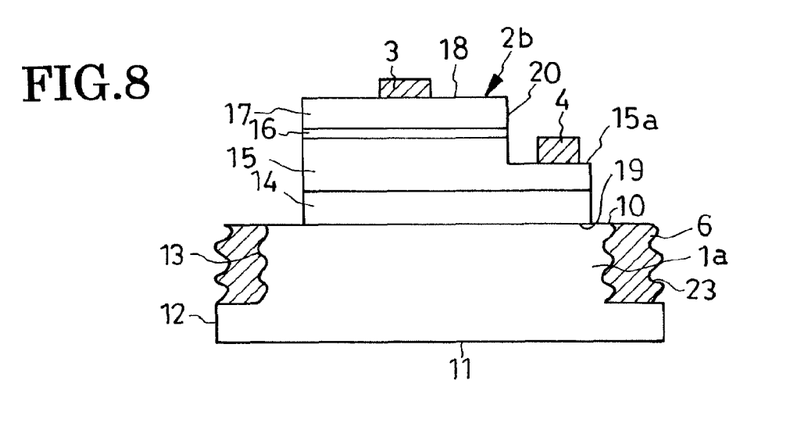
FIG. 8 is a vertical section through a further preferred form of LED according to the invention, the view not showing the encapsulation for simplicity.

Embodiment of FIG. 8

This LED is similar to that of FIG. 1 except for the shape of a light-generating semiconductor region $2_b$, the positioning of the second electrode 4, and use of an electrically insulating material for the substrate $1_a$. The light-generating semiconductor region $2_b$ has an offset $15_a$ formed by part of the n-type lower cladding 15 and the buffer layer 14. The cathode 4 is disposed on this offset $15_a$ contiguous to the lower cladding 15. The light-generating semiconductor region $2_b$ is grown on the substrate $1_a$ of insulating material.

As a modification of this FIG. 8 embodiment, the second electrode 4 could be disposed on an offset formed solely by the buffer layer 14. Also, the substrate $1_a$ could be of electroconductive material.

This embodiment gains all the benefits of that of FIG. 1 as the side surfaces 12 of the substrate $1_a$ is covered with the surface-roughened reflector layer 6. The arrangement of both electrodes 3 and 4 on the light-generating semiconductor region $2_b$ is intended to expedite electric connection of the LED to external circuitry. Further, as the second electrode 4 is connected to the n-type lower cladding 15 rather than to the buffer layer 14, the resistance between the electrodes 3 and 4 is reduced to a minimum. This electrode placement is applicable to all the foregoing embodiments.

Figure 9:
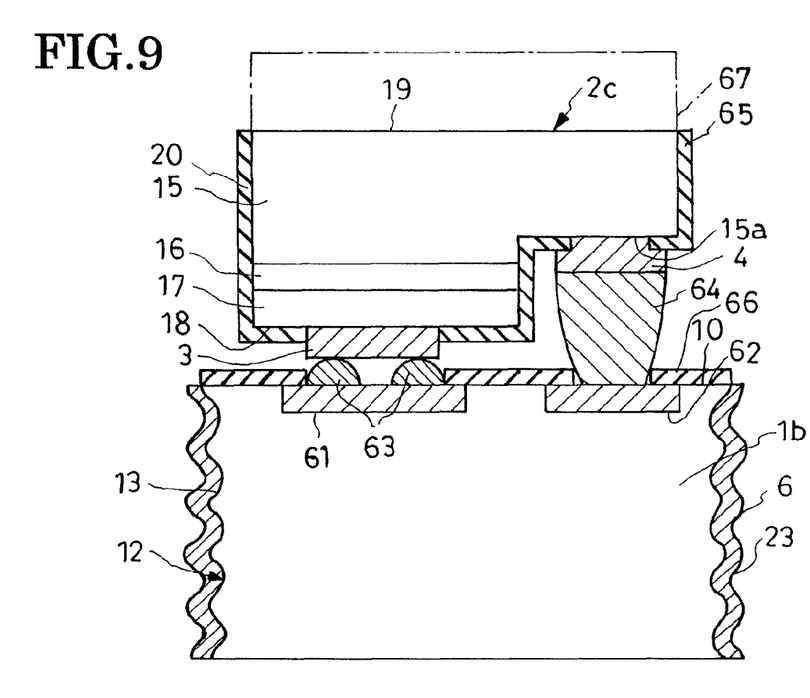
FIG. 9 is a vertical section through a still further preferred form of LED according to the invention, the view not showing the encapsulation for simplicity.

Embodiment of FIG. 9

The LED shown here may be thought of as having a light-generating semiconductor region $2_c$, which is similar to that designated $2_b$ in FIG. 8, placed upside down on a substrate $1_b$ of electrically insulating material. The light-generating semiconductor region $2_c$ has an overhang $15_a$, rather than the offset of its counterpart $2_b$ in FIG. 8, and has no buffer layer but is otherwise identical with the light-generating semiconductor region 2 of FIG. 1.

The first electrode 3 under the bottom or first major surface 18 of the light-generating semiconductor region $2_c$ is coupled, both mechanically and electrically, to a conductor layer 61 on the substrate $1_b$ via bump contacts 63. The second electrode 4 under the overhang $15_a$ of the light-generating semiconductor region $2_c$ is coupled, both mechanically and electrically, to another conductor layer 62 on the substrate $1_b$ via a bump contact 64. Both conductor layers 61 and 62 are embedded in the top or first major surface 10 of the substrate $1_b$. Light emits from the top or second major surface 19 of the light-generating semiconductor region $2_c$ into the inside of the transparent envelope similar to that shown at 5 in FIG. 5. Optionally, as indicated in phantom outline, a baseplate 67 of transparent material might be held against this light-emitting surface 19 of the light-generating semiconductor region $2_c$.

The light-generating semiconductor region $2_c$ has its bottom 18 and side 20 surfaces covered with a film 65 of electrically insulating material. The substrate $1_b$ also has its top surface 10 covered with an insulating film 66 except where the bump contacts 63 and 64 are situated. Constituting a feature of this invention, the reflector layer 6 covers the complete side surfaces 12 of the substrate $1_b$. As the substrate side surfaces 12 are roughened at 13, so are the surfaces 23 of the reflector layer 6.

Thus, despite the different positioning of the light-generating semiconductor region $2_c$ with respect to the substrate $1_b$, this LED with its surface-roughened reflector layer 6 possesses all the listed advantages of the first disclosed embodiment. The relative arrangement of the substrate $1_b$ and light-generating semiconductor region $2_c$ shown in FIG. 9 is applicable to all the other embodiments disclosed herein.

Possible Modifications

Notwithstanding the foregoing detailed disclosure it is not desired that the present invention be limited by the exact showings of the drawings or the description thereof. The following is a brief list of possible modifications, alterations or adaptations of the illustrated representative LEDs which are all believed to fall within the purview of the claims annexed hereto:

1. The light-generating semiconductor region 2 or 2$_a$ could be of other materials such as aluminum gallium indium phosphide (AlGaInP), aluminum gallium phosphide (AlGaAs), and gallium phosphide (GaP).

2. The first major surface 18 of the light-generating semiconductor region 2 or 2$_a$ could be covered with a film of optically transparent, electrically conductive material such as a mixture of indium oxide and tin oxide commonly known as ITO (indium tin oxide), and this film could be surface roughened for prevention of total reflection.

3. The second reflector layer 24 of the FIG. 3 embodiment could be incorporated in the embodiments of FIGS. 2, 4-9.

4. The LED wafer could be full diced instead of being half diced as in most of the embodiments disclosed herein. Preparatory to full dicing, dicing tape may be attached to the underside of the wafer for its stability during the dicing process.

5. The side surfaces 12 of the substrate 1 may be roughed by wet etching with an aqueous solution of fluoric acid and nitric acid.

What is claimed is:

1. A light-emitting semiconductor device comprising:
   (a) a substrate having a pair of opposite major surfaces and a side surface therebetween;
   (b) a light-generating semiconductor region formed on one of the pair of opposite major surfaces of the substrate for generating light to be emitted;
   (c) a first and a second electrode electrically connected to the light-generating semiconductor region;
   (d) a transparent envelope enclosing the substrate and the light-generating semiconductor region; and
   (e) a reflector layer covering at least a part of the surfaces of the substrate for reflecting the light that has been reflected from the transparent envelope, the reflector layer having a roughened surface for scattering the light impinging thereon.

2. A light-emitting semiconductor device as defined in claim 1, wherein the roughened surface is formed as a result of being formed on roughened part of the surfaces of the substrate.

3. A light-emitting semiconductor device as defined in claim 1, wherein the reflector layer covers at least part of the side surface of the substrate for reflecting the light that has been reflected from the transparent envelope.

4. A light-emitting semiconductor device as defined in claim 1, wherein the reflector layer covers at least part of said one of the pair of opposite major surfaces of the substrate.

5. A light-emitting semiconductor device as defined in claim 1, wherein the reflector layers covers both at least part of the side surface of the substrate and at least part of said one of the pair of opposite major surfaces of the substrate.

6. A light-emitting semiconductor device as defined in claim 1, wherein the side surface of the substrate is at an angle to the pair of opposite major surfaces thereof.

7. A light-emitting semiconductor device as defined in claim 1, further comprising a second reflector layer between the substrate and the light-generating semiconductor region.

8. A light-emitting semiconductor device as defined in claim 1, further comprising at least one other light-emitting semiconductor region on said one of the pair of opposite major surfaces of the substrate for generating light to be emitted.

9. A light-emitting semiconductor device as defined in claim 1, wherein the substrate is of electrically conducting material, wherein the first electrode is coupled to a major surface of the light-generating semiconductor region, and wherein the second electrode is coupled to the substrate.

10. A light-generating semiconductor region as defined in claim 1, wherein the light-generating semiconductor region comprises at least two semiconductor layers of opposite conductivity types, and wherein the first and the second electrode are coupled respectively to the two semiconductor layers of opposite conductivity types.

11. A light-generating semiconductor region as defined in claim 1, wherein the substrate has a first and a second conductor layer thereon, and wherein the first and the second electrode are both mechanically and electrically coupled to the first and the second conductor layer, respectively.

* * * * *